(12) United States Patent
Shih et al.

(10) Patent No.: US 10,170,328 B1
(45) Date of Patent: Jan. 1, 2019

(54) SEMICONDUCTOR PATTERN HAVING SEMICONDUCTOR STRUCTURES OF DIFFERENT LENGTHS

(71) Applicant: NANYA TECHNOLOGY CORPORATION, New Taipei (TW)

(72) Inventors: Chiang-Lin Shih, New Taipei (TW); Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/688,346

(22) Filed: Aug. 28, 2017

(51) Int. Cl.
   *H01L 21/308* (2006.01)
   *H01L 29/06* (2006.01)
   *H01L 21/3213* (2006.01)
   *H01L 21/311* (2006.01)
   *H01L 21/784* (2006.01)

(52) U.S. Cl.
   CPC ...... *H01L 21/3086* (2013.01); *H01L 21/3083* (2013.01); *H01L 21/31144* (2013.01); *H01L 21/3213* (2013.01); *H01L 21/32139* (2013.01); *H01L 21/784* (2013.01); *H01L 29/0657* (2013.01)

(58) Field of Classification Search
   None
   See application file for complete search history.

(56) References Cited

U.S. PATENT DOCUMENTS 9,455,230 B1 * 9/2016 Park .................. H01L 23/49827
9,773,901 B1 * 9/2017 Gluschenkov ...... H01L 29/7827
9,824,934 B1 * 11/2017 Bi .................... H01L 21/823487

FOREIGN PATENT DOCUMENTS

TW          201642399 A      12/2016

* cited by examiner

*Primary Examiner* — Minh-Loan Tran
(74) *Attorney, Agent, or Firm* — Muncy, Geissler, Olds & Lowe, P.C.

(57) ABSTRACT

The present disclosure provides a semiconductor pattern and a method for preparing the same. The semiconductor pattern includes a substrate, a plurality of first semiconductor structures disposed over the substrate, a plurality of second semiconductor structures disposed over the substrate, and a semiconductor frame structure disposed over the substrate. The first semiconductor structures and the second semiconductor structures are alternately arranged. The semiconductor frame structure encircles the first semiconductor structures and the second semiconductor structures. The first semiconductor structures include a first length, the second semiconductor structures include a second length, and the first length of the first semiconductor structures is less than the second length of the second semiconductor structures.

9 Claims, 11 Drawing Sheets

SEMICONDUCTOR PATTERN HAVING SEMICONDUCTOR STRUCTURES OF DIFFERENT LENGTHS

TECHNICAL FIELD

The present disclosure relates to a semiconductor pattern and a method for preparing the same, and more particularly, to a semiconductor pattern and a self-cutting method for preparing the same.

DISCUSSION OF THE BACKGROUND

In semiconductor manufacturing processes, photolithography techniques are commonly adopted to define structures. Typically, an integrated circuit layout is designed and outputted onto one or more photomasks. The integrated circuit layout is then transferred from the photomask(s) to a mask layer to form a mask pattern, and to a target layer from the mask pattern. However, with the advancing miniaturization and integration requirements of semiconductor devices, including memory device such as dynamic random access memories (DRAMs), flash memory, static random access memories (SRAMs), and ferroelectric (FE) memories, the semiconductor structures or features for such devices become finer and more miniaturized as well. Accordingly, the continual reduction in semiconductor structure and feature sizes places ever-greater demands on the techniques used to form the structures and features.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a semiconductor pattern. The semiconductor pattern includes a substrate, a plurality of first semiconductor structures disposed over the substrate, a plurality of second semiconductor structures disposed over the substrate, and a semiconductor frame structure disposed over the substrate. The first semiconductor structures and the second semiconductor structures are alternately arranged. The semiconductor frame structure encircles the first semiconductor structures and the second semiconductor structures. The first semiconductor structures include a first length, the second semiconductor structures include a second length, and the first length of the first semiconductor structures is less than the second length of the second semiconductor structures.

In some embodiments, the first semiconductor structures and the second semiconductor structures extend along a first direction and are arranged along a second direction perpendicular to the first direction.

In some embodiments, each of the first semiconductor structures is spaced apart from the semiconductor frame structure by a first gap along the first direction, and each of the second semiconductor structures is spaced apart from the semiconductor frame structure by a second gap along the first direction.

In some embodiments, the first gaps are larger than the second gaps.

In some embodiments, the first semiconductor structures and the second semiconductor structures are spaced apart from each other by a third gap along the second direction.

In some embodiments, the semiconductor frame structure includes at least one first portion and one second portion, wherein the first portion and the second portion are perpendicular to each other.

In some embodiments, the first portion of the semiconductor frame structure is perpendicular to the first semiconductor structures and the second semiconductor structures, and the second portion of the semiconductor frame structure is parallel to the first semiconductor structures and the second semiconductor structures.

In some embodiments, one of the second semiconductor structures is disposed between the second portion of the semiconductor frame structure and the first semiconductor structures.

In some embodiments, the first semiconductor structures, the second semiconductor structures, and the semiconductor frame structure include a same material.

Another aspect of the present disclosure provides a method for preparing a semiconductor pattern. The method includes the following steps. A substrate is provided. A plurality of first core features and at least one frame feature encircling the first core features are formed over the substrate. The first core features extended along a first direction and are arranged along a second direction perpendicular to the first direction. The first core features include a first length. Each of the first core features is spaced apart from the frame feature by a first gap along the first direction. Subsequently, a spacer layer is formed to fill the first gaps and to form a plurality of individual recesses entirely separated from each other. A plurality of second core features is then formed in the individual recesses. The second core features are entirely separated from each other by the spacer layer, and the second core features are spaced apart from the frame feature by the spacer layer. The second core features include a second length. The spacer layer is removed from the substrate to form a plurality of openings between the first core features, the second core features and the frame feature.

In some embodiments, the step of forming the plurality of first core features and the at least one frame feature over the substrate further include the following steps: A first sacrificial layer is formed over the substrate. A patterned photoresist is formed over the first sacrificial layer, and the first sacrificial layer is etched through the patterned photoresist to form the plurality of first core features and the at least one frame feature simultaneously.

In some embodiments, the method of preparing the semiconductor pattern further includes performing a trimming step on the patterned photoresist before etching the first sacrificial layer.

In some embodiments, a width of the first gaps is equal to or less than two times a thickness of the spacer layer.

In some embodiments, the step of forming the plurality of second core features further includes the following steps: A second sacrificial layer is formed to fill the individual recesses, and a portion of the second sacrificial layer is removed to form the plurality of second core features in the individual recesses and to expose portions of the spacer layer.

In some embodiments, the second length of the second core features is greater than the first length of the first core patterns.

In some embodiments, each of the second core features is spaced apart from the frame pattern by a second gap along the first direction, wherein the second gap is smaller than the first gap.

In some embodiments, the first core features and second core features are alternately arranged along the second direction, and spaced apart from each other by a third gap along the second direction, wherein a width of the third gaps is substantially the same as a thickness of the spacer layer.

In some embodiments, one of the second core features is adjacent to the frame feature along the second direction, and is spaced apart from the frame feature by the third gap.

In some embodiments, the substrate further comprises a hard mask formed thereon.

In some embodiments, the method for preparing the semiconductor pattern further includes transferring the first core features, the second core features and the frame feature to the substrate to form a plurality of first semiconductor structures including the first length, a plurality of second semiconductor structures including the second length and a semiconductor frame structure.

In the present disclosure, the frame feature is provided, and the first gaps between the first core features and the frame feature are formed. More importantly, the first gaps are filled with the spacer layer and the plurality of individual recesses is formed. The second core features formed in the individual recesses are entirely separated from each other by the spacer layer. After removing the spacer layer, the first core features, the second core features and the frame feature, which are spaced apart from each other, can be transferred to the substrate and/or a target layer. Accordingly, the first semiconductor structures, the second semiconductor structures and the semiconductor frame structure obtained by the abovementioned transferring are spaced apart from each other. The method for preparing the semiconductor structure is referred to as a self-cutting method.

In contrast, with a comparative method applied without providing the frame feature, no individual recesses are formed between the first core features. More importantly, the subsequently-formed second core features are all connected to each other to form a comb-like pattern. Consequently, a plurality of second semiconductor structures that are connected to each other is obtained by transferring the second core features. Therefore, one or more additional cutting steps are required to disconnect and separate the second semiconductor structures. Accordingly, process cost and process time are increased due to the cutting required with such methods.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

FIGS. 2A to 2C are schematic diagrams illustrating a fabrication stage constructed according to the method for preparing the semiconductor pattern in accordance with some embodiments of the present disclosure, wherein FIG. 2B is a cross-sectional view taken along line A-A' of FIG. 2A, and FIG. 2C is a cross-sectional view taken along line B-B' of FIG. 2A.

FIGS. 3A to 3C are schematic diagrams illustrating a fabrication stage constructed according to the method for preparing the semiconductor pattern in accordance with some embodiments of the present disclosure, wherein FIG. 3B is a cross-sectional view taken along line A-A' of FIG. 3A, and FIG. 3C is a cross-sectional view taken along line B-B' of FIG. 3A.

FIGS. 4A to 4C are schematic diagrams illustrating a fabrication stage subsequent to the fabrication stage shown in FIGS. 3A-3C, wherein FIG. 4B is a cross-sectional view taken along line A-A' of FIG. 4A, and FIG. 4C is a cross-sectional view taken along line B-B' of FIG. 4A.

FIGS. 5A to 5C are schematic diagrams illustrating a fabrication stage subsequent to the fabrication stage shown in FIGS. 4A-4C, wherein FIG. 5B is a cross-sectional view taken along line A-A' of FIG. 5A, and FIG. 5C is a cross-sectional view taken along line B-B' of FIG. 5A.

FIGS. 6A to 6C are schematic diagrams illustrating a fabrication stage subsequent to the fabrication stage shown in FIGS. 5A-5C, wherein FIG. 6B is a cross-sectional view taken along line A-A' of FIG. 6A, and FIG. 6C is a cross-sectional view taken along line B-B' of FIG. 6A.

FIGS. 7A to 7C are schematic diagrams illustrating a fabrication stage subsequent to the fabrication stage shown in FIGS. 6A-6C, wherein FIG. 7B is a cross-sectional view taken along line A-A' of FIG. 7A, and FIG. 7C is a cross-sectional view taken along line B-B' of FIG. 7A.

FIGS. 8A to 8C are schematic diagrams illustrating a fabrication stage subsequent to the fabrication stage shown in FIGS. 7A-7C, wherein FIG. 8B is a cross-sectional view taken along line A-A' of FIG. 8A, and FIG. 8C is a cross-sectional view taken along line B-B' of FIG. 8A.

FIGS. 9A to 9C are schematic diagrams illustrating a fabrication stage subsequent to the fabrication stage shown in FIGS. 8A-8C, wherein FIG. 9B is a cross-sectional view taken along line A-A' of FIG. 9A, and FIG. 9C is a cross-sectional view taken along line B-B' of FIG. 9A.

FIGS. 10A to 10C are schematic diagrams illustrating a fabrication stage subsequent to the fabrication stage shown in FIGS. 9A-9C, wherein FIG. 10B is a cross-sectional view taken along line A-A' of FIG. 10A, and FIG. 10C is a cross-sectional view taken along line B-B' of FIG. 10A.

FIGS. 11A to 11C are schematic diagrams illustrating a fabrication stage subsequent to the fabrication stage shown in FIGS. 10A-10C, wherein FIG. 11B is a cross-sectional view taken along line A-A' of FIG. 11A, and FIG. 11C is a cross-sectional view taken along line B-B' of FIG. 11A.

DETAILED DESCRIPTION

Figure 1:
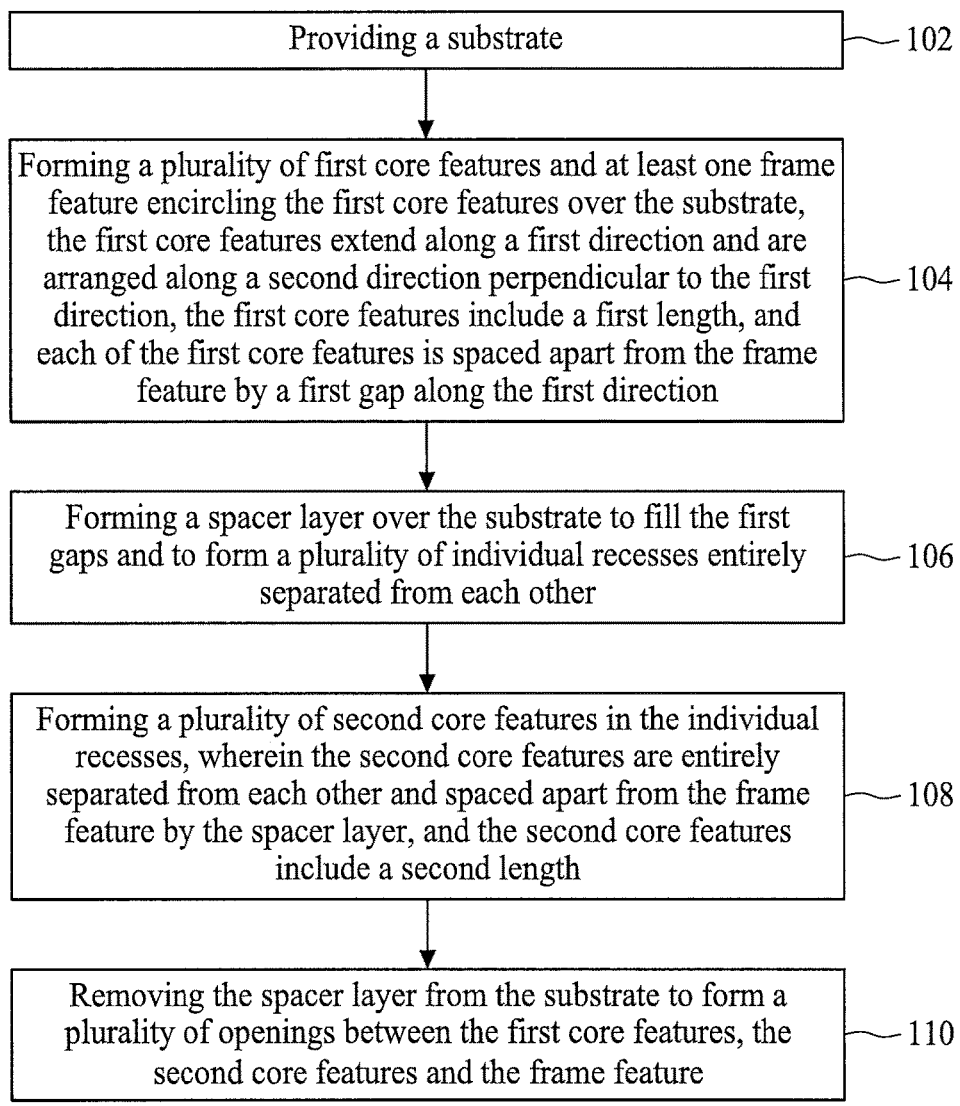
FIG. 1 is a flow diagram illustrating a method for preparing semiconductor structures, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the term's first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the term "feature" refers to parts of a pattern, such as lines, spaces, via, pillars, trenches, troughs, or moats. As used herein, the term "core" refers a mask feature formed at a vertical level. As used herein, "target layer" refers to a layer in which a pattern of semiconductor structures to be formed. A target layer may be part of the substrate. A target layer may be a metal layer, a semiconductor layer, and/or an insulating layer formed over the substrate.

As used herein, the terms "patterning" and "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch or other removal process. The mask can be a photoresist, or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

FIG. 1 is a flow diagram illustrating a method for preparing a semiconductor pattern, in accordance with some embodiments of the present disclosure. The method for preparing a semiconductor pattern 10 includes a step 102, providing a substrate. The method for preparing the semiconductor pattern 10 further includes a step 104, forming a plurality of first core features and at least one frame feature encircling the first core features over the substrate. The first core features extend along a first direction and are arranged along a second direction perpendicular to the first direction. The first core features include a first length, and each of the first core features is spaced apart from the frame feature by a first gap along the first direction. The method for preparing the semiconductor pattern 10 further includes a step 106, forming a spacer layer over the substrate to fill the first gaps and to form a plurality of individual recesses entirely separated from each other. The method for preparing the semiconductor pattern 10 further includes a step 108, forming a plurality of second core features in the individual recesses. The second core features are entirely separated from each other and are spaced apart from the frame feature by the spacer layer. The second core features include a second length. The method for preparing the semiconductor pattern 10 further includes a step 110, removing the spacer layer from the substrate to form a plurality of openings between the first core features, the second core features and the frame feature. The method for preparing the semiconductor pattern 10 will be further described according to one or more embodiments.

Figure 2A:
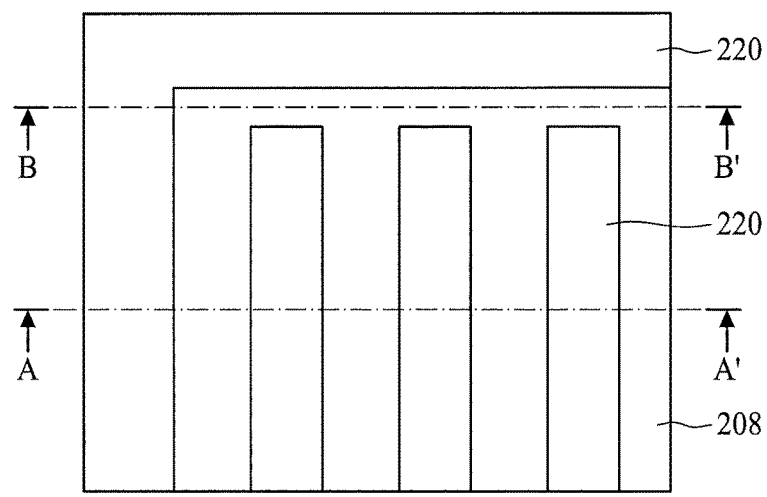
Figure 2B:
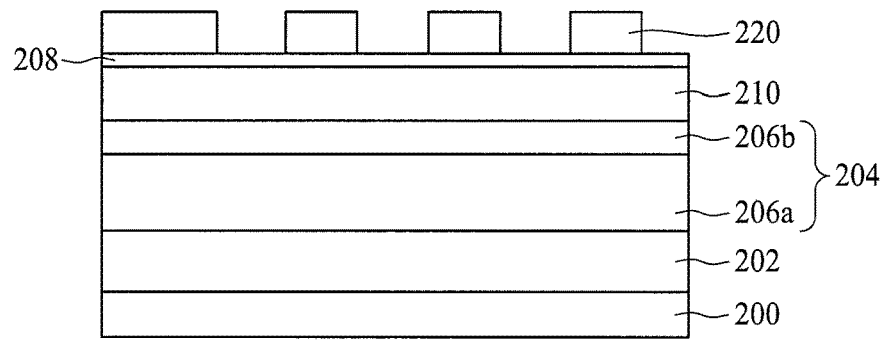
Figure 2C:
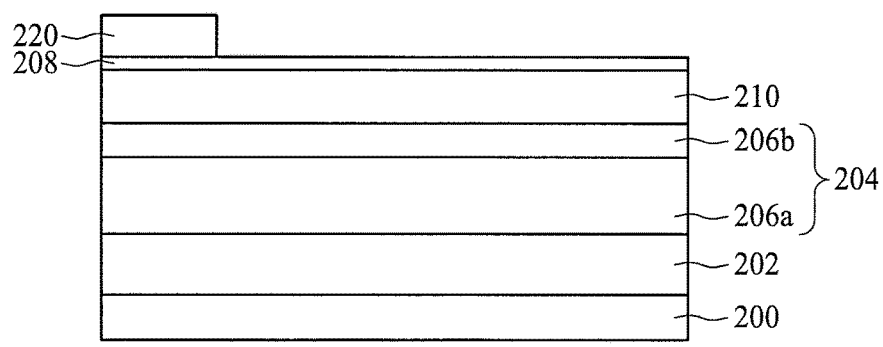

FIGS. 2A to 2C are schematic diagrams illustrating a fabrication stage constructed according to the method for preparing the semiconductor pattern 10 in accordance with some embodiments of the present disclosure, wherein FIG. 2B is a cross-sectional view taken along line A-A' of FIG. 2A, and FIG. 2C is a cross-sectional view taken along line B-B' of FIG. 2A. Referring to FIGS. 2A to 2C, a substrate 200 is provided according to step 102. The substrate 200 can include silicon (Si), gallium (Ga), gallium arsenide (GaAs), gallium nitride (GaN), strained silicon, silicon-germanium (SiGe), silicon carbide (SiC), diamond, epitaxy layer or the combination thereof. In some embodiments of the present disclosure, a target layer 202 is formed over the substrate 200. The target layer 202 can include a multiple layers or a single layer. The target layer 202 may be a layer in which various IC components, parts, or structures are to be formed through IC fabrication processes. Examples of the components, parts, and structures include transistors, capacitors, resistors, diodes, conductive lines, electrodes, spacers, trenches, etc. The target layer 202 can include materials that are selected based on the types of devices to be formed. Examples of the target layer materials include, for example but not limited to, dielectric materials, semiconductive materials, and conductive materials.

Still referring to FIGS. 2A to 2C, a hard mask 204 is provided over the target layer 202 and the substrate 200. In some embodiments of the present disclosure, the hard mask 204 includes a multi-layered structure. For example but not limited to, the hard mask 204 can include at least one first mask layer 206a and one second mask layer 206b stacked on the first mask layer 206a. More importantly, the first mask layer 206a and the second mask layer 206b can include different materials or materials sufficiently different in compositions that the second mask layer 206b can be selectively removable using an appropriate etch chemistry relative to the first mask layer 206a. By way of example and not limitation, the first mask layer 206a can include a silicon oxide (SiO) material, a silicon nitride (SiN) material, or a silicon oxynitride (SiON) material. The second mask layer 206b can include SiO material, SiN material, or SiON material. The second mask layer 206b can be selected such that the second mask layer 206b is selectively removed without affecting the first mask layer 206a when using an appropriate chemistry. One of ordinary skill in the art would easily understand that the present disclosure may select a single hard mask or a bi-layered hard mask based on cost, time, performance, and processing considerations for a given application.

Still referring to FIGS. 2A to 2C, a first sacrificial layer 210 is formed over the hard mask 204. In some embodiments of the present disclosure, the first sacrificial layer 210 can include organic materials, and the organic materials can include photosensitive materials or non-photosensitive materials, but the disclosure is not limited thereto. Additionally, a mask layer 208 can be selectively formed over the first sacrificial layer 210 as shown in FIGS. 2A to 2C. However, in some embodiments of the present disclosure, the mask layer 208 can be omitted. In some embodiments of the present disclosure, the mask layer 208 may provide improved etch selectivity and/or antireflective properties for removing the first sacrificial layer 210, and may provide a substantially planar surface on which additional materials may be formed, as explained below. Over the mask layer 208 and/or the first sacrificial layer 210, a patterned photoresist 220 is formed as shown in FIGS. 2A to 2C. The patterned photoresist 220 can include lines formed by performing, for example but not limited to, conventional photolithography, as is known in the art of semiconductor manufacturing.

Figure 3A:
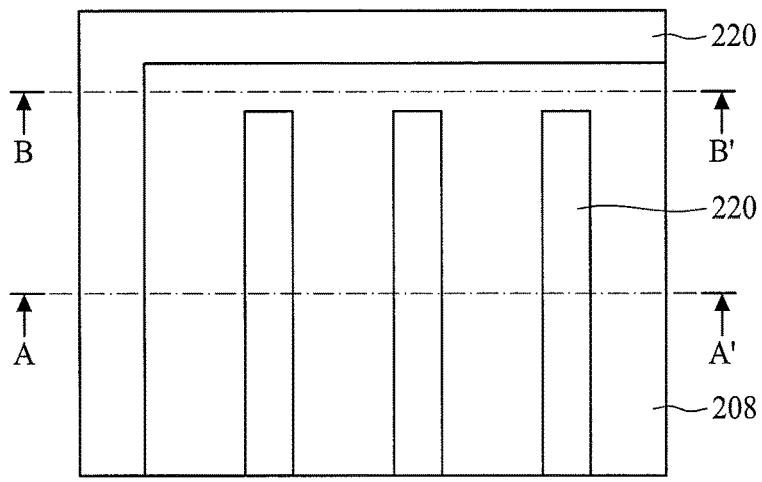
Figure 3B:
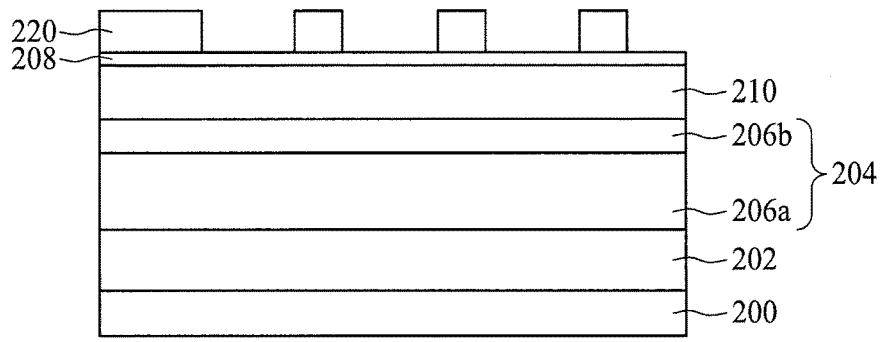
Figure 3C:
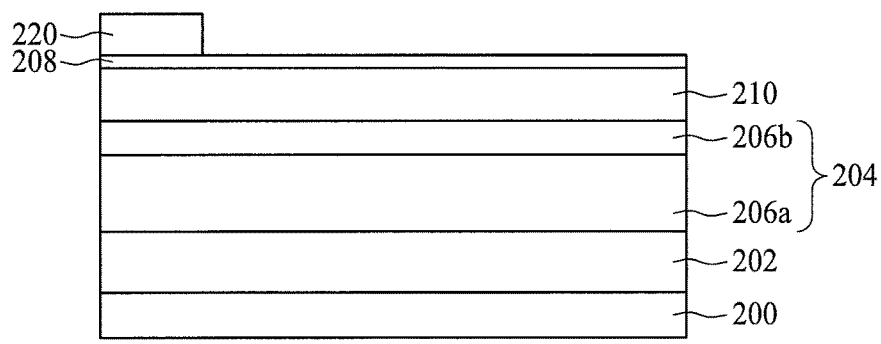

FIGS. 3A to 3C, are schematic diagrams illustrating a fabrication stage constructed according to the method for preparing the semiconductor structures in accordance with some embodiments of the present disclosure, wherein FIG. 3B is a cross-sectional view taken along line A-A' of FIG. 3A, and FIG. 3C is a cross-sectional view taken along line B-B' of FIG. 3A. In some embodiments of the present disclosure, a trimming step can be performed on the patterned photoresist 220, such that a width of the patterned photoresist 220 can be further reduced as shown in FIGS. 3A to 3C. However, in some embodiments of the present disclosure, when the patterned photoresist 220 including the desired width is formed by the conventional photolithography, the trimming step can be omitted.

Figure 4A:
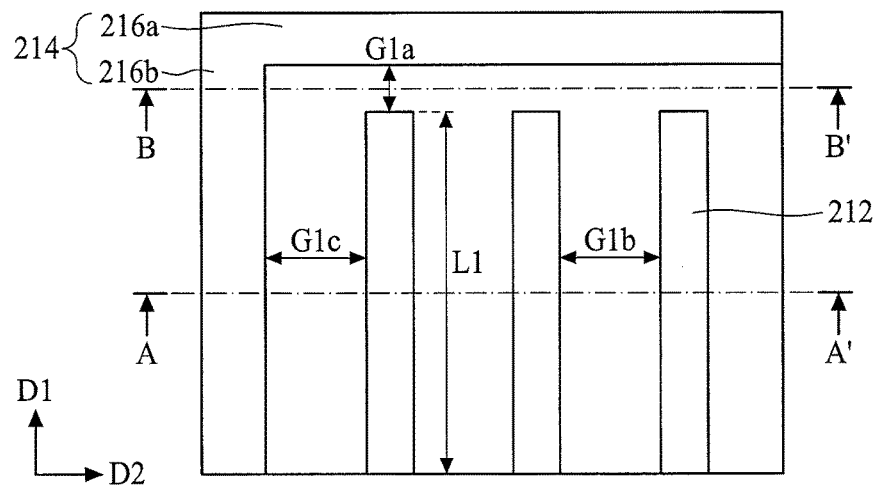
Figure 4B:
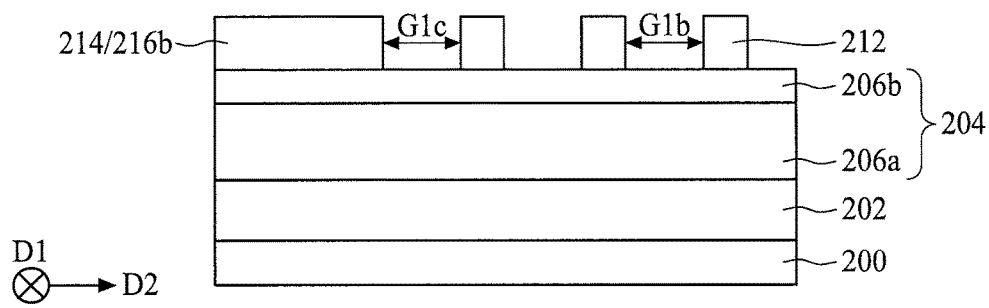
Figure 4C:
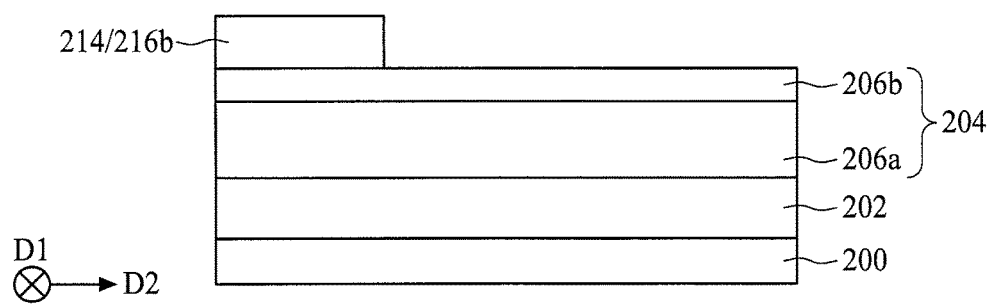

FIGS. 4A to 4C are schematic diagrams illustrating a fabrication stage subsequent to the fabrication stage shown in FIGS. 3A-3C, wherein FIG. 4B is a cross-sectional view taken along line A-A' of FIG. 4A, and FIG. 4C is a cross-sectional view taken along line B-B' of FIG. 4A. The first sacrificial layer 210 is then etched through the patterned photoresist 220 to simultaneously form a plurality of first core features 212 and at least one frame feature 214 over the substrate 200 according to step 104. It should be easily realized by those skilled in the art that the first core features 212 include the lines as defined by the patterned photoresist 220 and the frame feature 214 includes the frame shape as defined by the patterned photoresist. Thereafter, the patterned photoresist 220 is removed. As shown in FIG. 4A, the first core features 212 extend along a first direction D1 and are arranged along a second direction D2 perpendicular to the first direction D1. The first core features 212 include a first length L1. Additionally, although a portion of the first core features 212 and a portion of the frame feature 214 are shown in FIG. 4A, those skilled in the art would easily realize that the frame feature 214 encircles the first core features 212, but the disclosure is not limited thereto. Furthermore, the frame feature 214 can be formed in an array edge region of the substrate 200 in accordance with the present embodiment, but the disclosure is not limited thereto.

In some embodiments of the present disclosure, the frame feature 214 includes a first portion 216a and a second portion 216b. The first portion 216a extends along the second direction D2 and the second portion 216b extends along the first direction D1. Each of the first core features 212 is spaced apart from the first portion 216a of the frame feature 214 by a gap G1a along the first direction D1 as shown in FIG. 4A. The first core features 212 are spaced apart from each other by another gap G1b. Furthermore, the first core feature 212 is spaced apart from the second portion 216b of the frame feature 214 by a gap G1c, and a width of the gap G1c is the same as a width of the gap G1b. More importantly, a width of the gaps G1a is equal to or less than two times a thickness of a spacer layer, which is to be formed and will be further described.

Figure 5A:
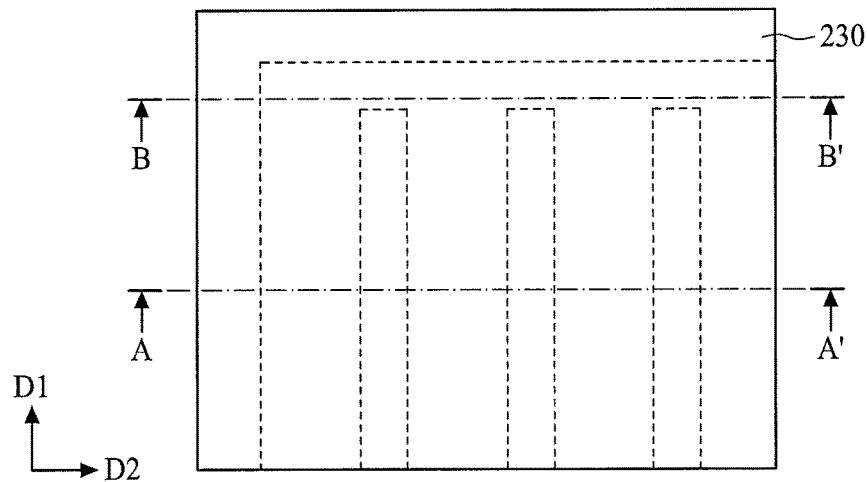
Figure 5B:
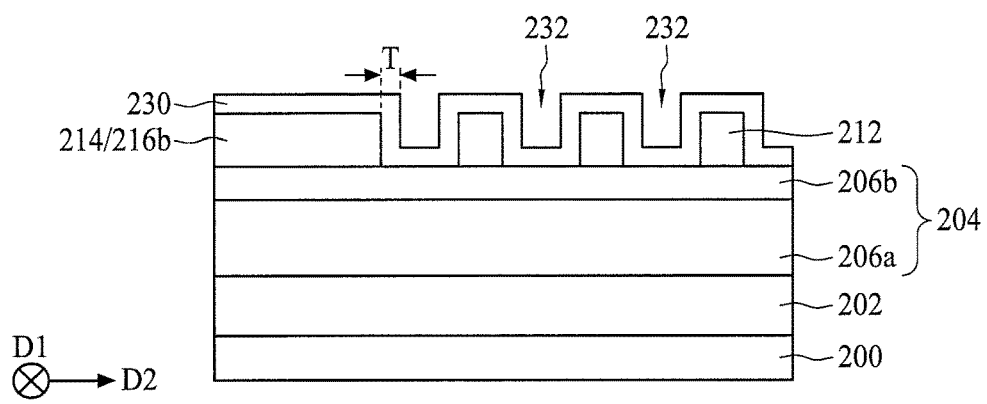
Figure 5C:
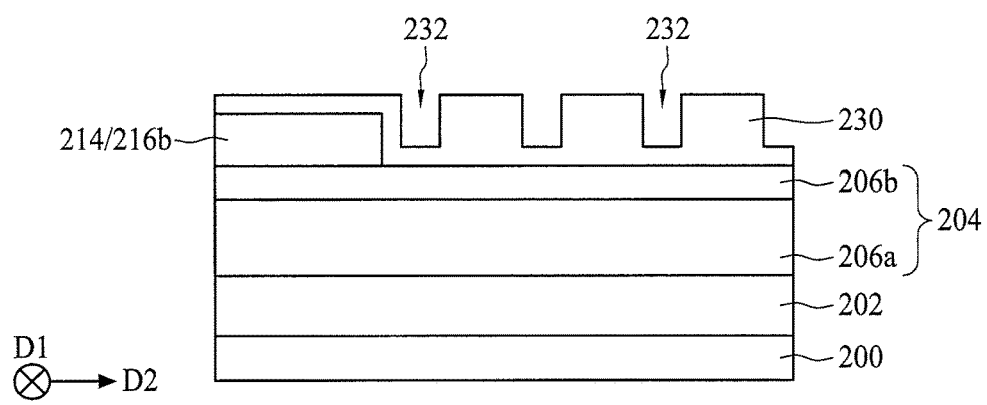

FIGS. 5A-5C are schematic diagrams illustrating a fabrication stage subsequent to the fabrication stage shown in FIGS. 4A to 4C, wherein FIG. 5B is a cross-sectional view taken along line A-A' of FIG. 5A, and FIG. 5C is a cross-sectional view taken along line B-B' of FIG. 5A. A spacer layer 230 is formed over the substrate 200 according to step 106. The spacer layer 230 is conformally formed to cover or coat sidewalls and top surfaces of each first core feature 212 and the frame feature 214 as shown in FIGS. 5A to 5C. The spacer layer 230 can include materials different from those of the first sacrificial layer 210, but the disclosure is not limited thereto. In some embodiments of the present disclosure, the spacer layer 230 can include, for example but not limited to, silicon nitride (SiN), silicon oxide (SiO), silicon oxynitride (SiON), a combination thereof, a stack layer thereof, or the like. The spacer layer 230 includes a thickness T. It should be noted that since the width of the gaps G1a between the first portion 216a of the frame feature 214 and the first core features 212 is equal to or less than two times the thickness T of the spacer layer 230, the gaps G1a are filled by the spacer layer 230 as shown in FIGS. 5A and 5C. More importantly, a plurality of individual recesses 232 entirely separated from each other is formed. As shown in FIGS. 5B to 5C, the spacer layer 230 forms bottoms and sidewalls of the individual recesses 232.

Figure 6A:
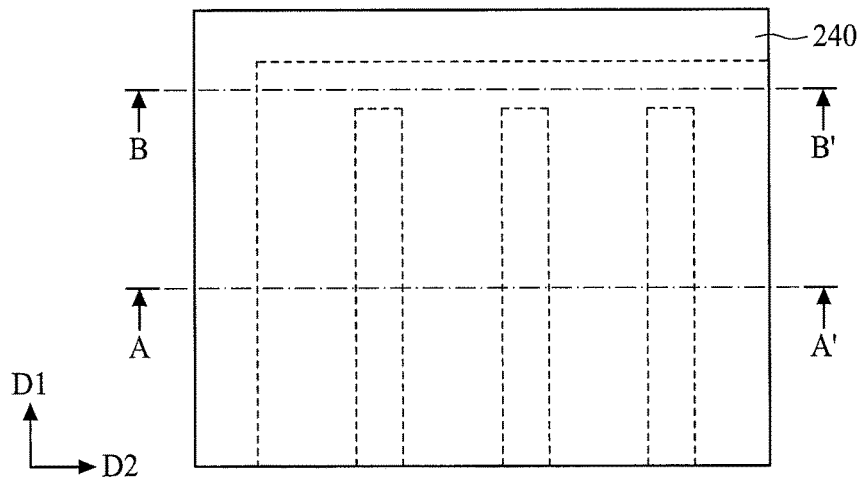
Figure 6B:
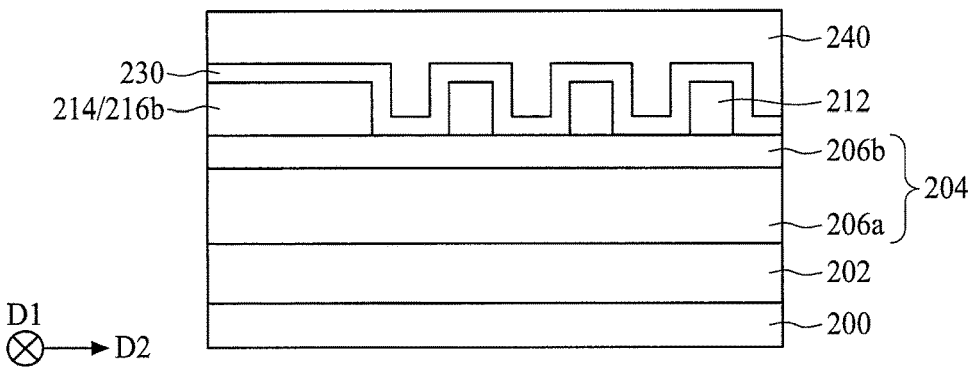
Figure 6C:
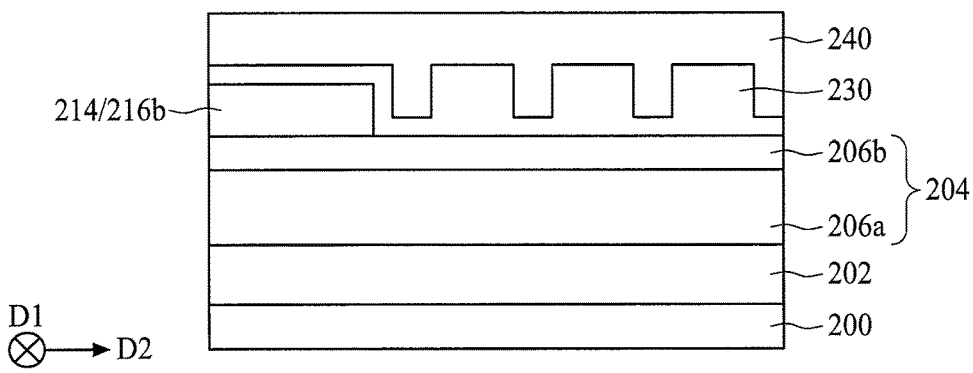

FIGS. 6A-6C are schematic diagrams illustrating a fabrication stage subsequent to the fabrication stage shown in FIGS. 5A-5C, wherein FIG. 6B is a cross-sectional view taken along line A-A' of FIG. 6A, and FIG. 6C is a cross-sectional view taken along line B-B' of FIG. 6A. Referring to FIGS. 6A to 6C, a second sacrificial layer 240 is formed over the substrate 200. The second sacrificial layer 240 is formed to fill the gaps G1a, G1b and G1c. In some embodiments of the present disclosure, the second sacrificial layer 240 can include organic materials, and the organic materials can include photosensitive materials or a non-photosensitive materials, but the disclosure is not limited thereto. In some embodiments of the present disclosure, the second sacrificial layer 240 includes materials different from those of the first sacrificial layer 210. In some embodiments of the present disclosure, the first sacrificial layer 210 and the second sacrificial layer 240 include the same material.

Figure 7A:
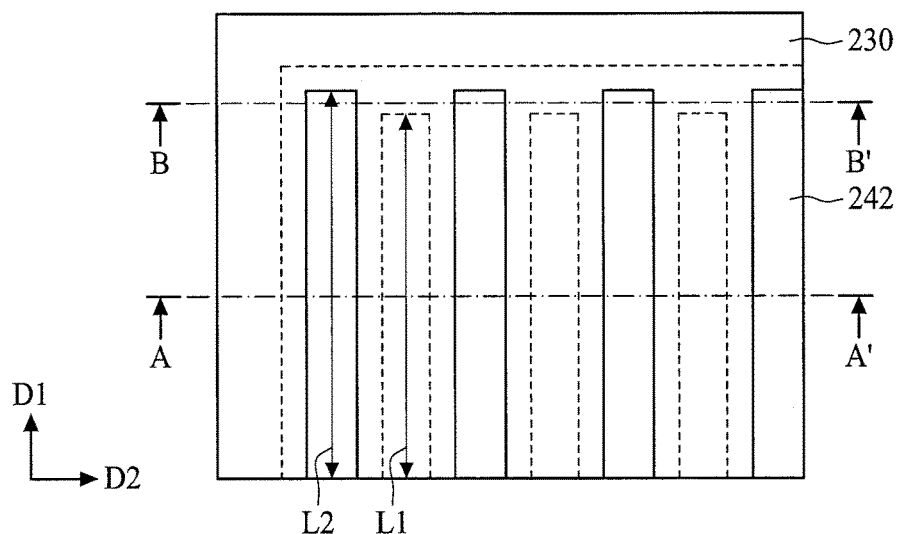
Figure 7B:
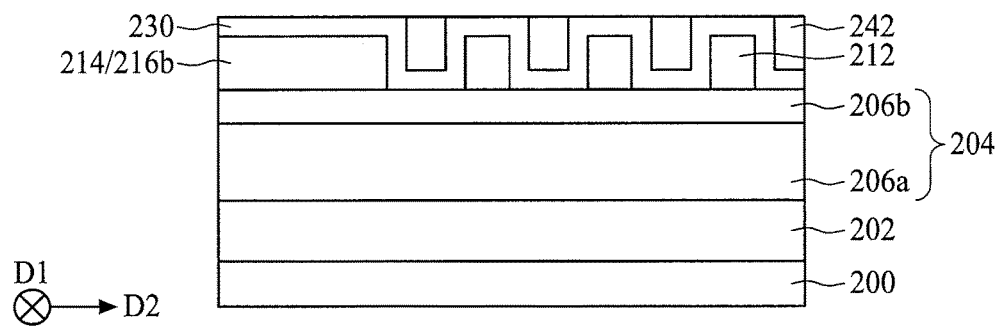
Figure 7C:
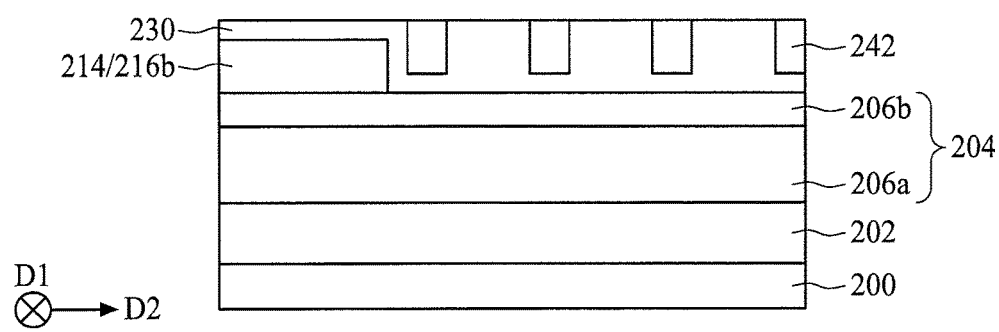

FIGS. 7A-7C are schematic diagrams illustrating a fabrication stage subsequent to the fabrication stage shown in FIGS. 6A-6C, wherein FIG. 7B is a cross-sectional view taken along line A-A' of FIG. 7A, and FIG. 7C is a cross-sectional view taken along line B-B' of FIG. 7A. In some embodiments of the present disclosure, a portion of the second sacrificial layer 240 can be removed by an etching back process, but the disclosure is not limited thereto. According to step 108 in some embodiments of the present disclosure, the second sacrificial layer 240 is etched back to expose the spacer layer 230 over the top surfaces and the sidewalls of the first core features 212 as shown in FIGS. 7A to 7C. Accordingly, the remaining second sacrificial layer 240 can include a plurality of second core features 242. More importantly, the second core feature 242 is formed to fill one individual recess 232 as shown in FIG. 7A. Accordingly, the second core features 242 are entirely separated from each other and are spaced apart from the frame feature 214 by the spacer layer 230. Moreover, the first core features 212 and the second core features 242 are alternately arranged along the second direction D2, and the adjacent first core feature 212 and the second core feature 242 are spaced apart from each other by the spacer layer 230, which includes the thickness T as shown in FIG. 7B. Referring back to FIG. 7A, the second core features include a second length L2, and the second length L2 is greater than the first length L1 of the first core features 212.

Figure 8A:
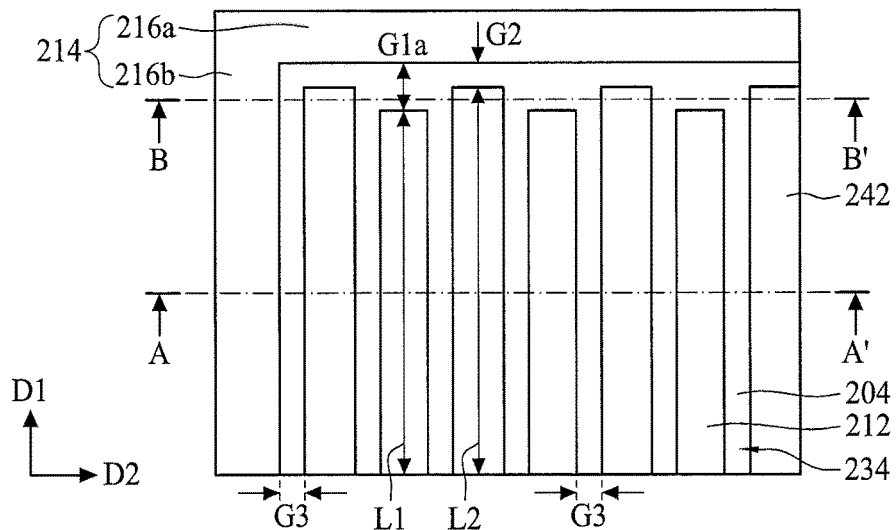
Figure 8B:
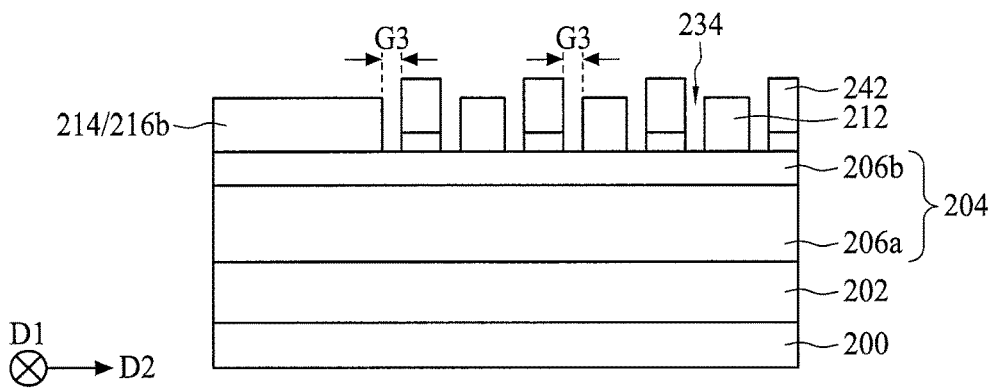
Figure 8C:
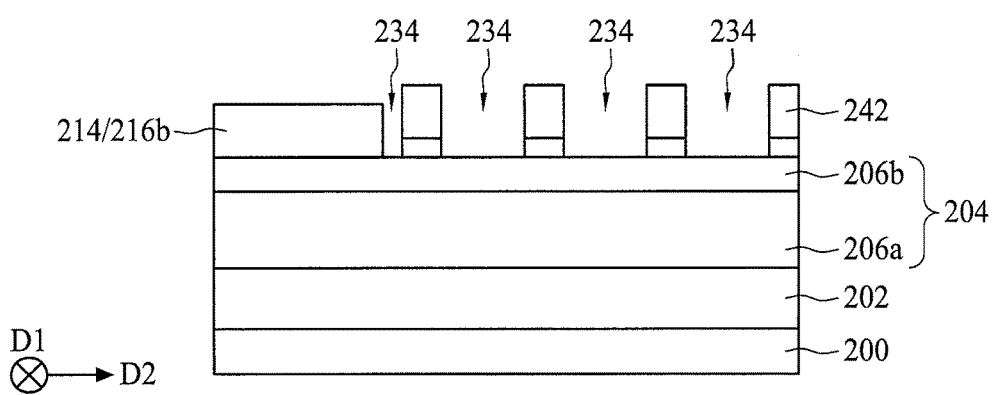

FIGS. 8A to 8C are schematic diagrams illustrating a fabrication stage subsequent to the fabrication stage shown in FIGS. 7A-7C, wherein FIG. 8B is a cross-sectional view taken along line A-A' of FIG. 8A, and FIG. 8C is a cross-sectional view taken along line B-B' of FIG. 8A. Next, the spacer layer 230 is removed from the substrate 200 to form a plurality of openings 234 between the first core features 212, the second core features 242, and the frame feature 214 according to step 110. Accordingly, the first core features 212, the second core features 242 and the frame feature 214 are spaced apart from each other by the openings 234. Additionally, heights of the first core features 212 and the frame feature 214 can be less than a height of the second core features 242 in accordance with the present embodiment, but the disclosure is not limited thereto.

Still referring to FIGS. 8A to 8C, each of the first core features 212 is spaced apart from the frame feature 214, especially the first portion 216a of the frame feature 214 by the gap G1a along the first direction D1. Each of the second core features 242 is spaced apart from the frame feature 214, especially the first portion 216a of the frame feature 214 by the gap G2 along the first direction D1. More importantly, the gaps G2 are smaller than the gaps G1a. The first core features 212 and the second core features 242 are alternately arranged along the second direction D2. The first core features 212 and second core features 242 are spaced apart from each other by a gap G3 along the second direction D2, and a width of the gaps G3 is substantially the same as the thickness T of the spacer layer 230. Furthermore, one of the second core features 242 is adjacent to the frame feature 214 along the second direction D2. As shown in FIG. 8A, the second core feature 242 adjacent to the second portion 216b of the frame feature 214 is spaced apart from the second portion 216b of the frame feature 214 by the gap G3, which is substantially the same as the thickness T of the spacer layer 230. In some embodiments of the present disclosure, the hard mask 204 can be exposed between the first core features 212, the second core features 242 and the frame feature 214. In other words, the hard mask 204 can be exposed at bottoms of the openings 234.

Figure 9A:
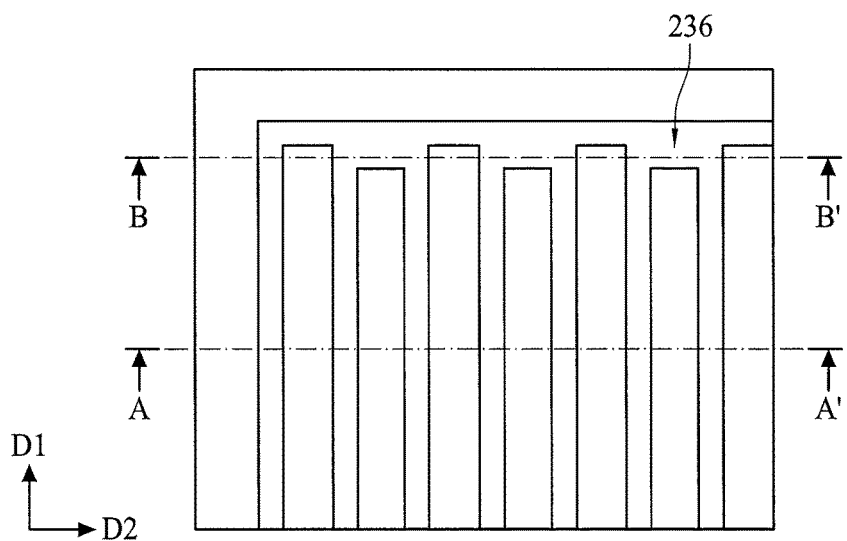
Figure 9B:
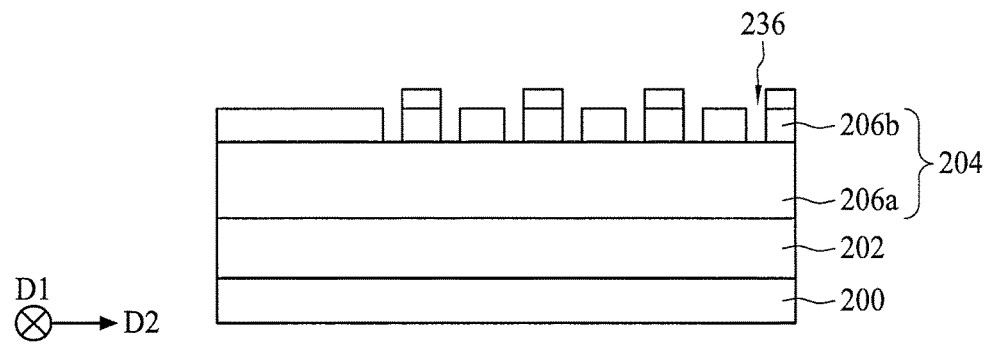
Figure 9C:
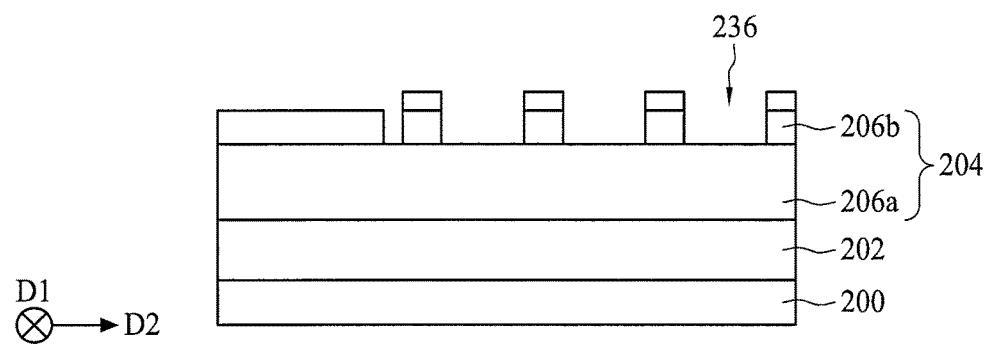

FIGS. 9A to 9C are schematic diagrams illustrating a fabrication stage subsequent to the fabrication stage shown in FIGS. 8A-8C, wherein FIG. 9B is a cross-sectional view taken along line A-A' of FIG. 9A, and FIG. 9C is a cross-sectional view taken along line B-B' of FIG. 9A. Next, the first core features 212, the second core features 242 and the frame feature 214 are transferred to the substrate 204 or the target layer 202. In some embodiments of the present disclosure, the exposed hard mask 204 is etched to form a plurality of recesses 236. As shown in FIGS. 9A to 9C, the recesses 236 are formed between the first core features 212, the second core features 242 and the frame feature 214. In some embodiments of the present disclosure, the recesses 236 can be formed in at least the second hard mask layer 206b, but the disclosure is not limited thereto.

Figure 10A:
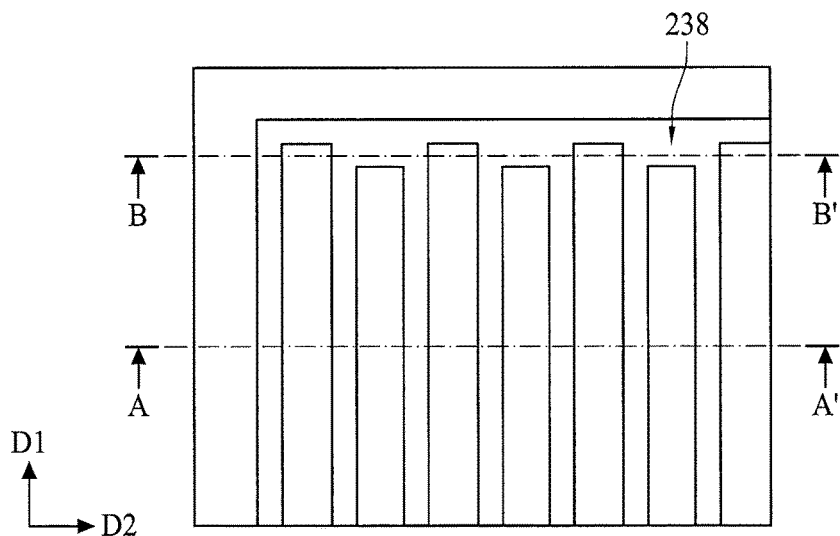
Figure 10B:
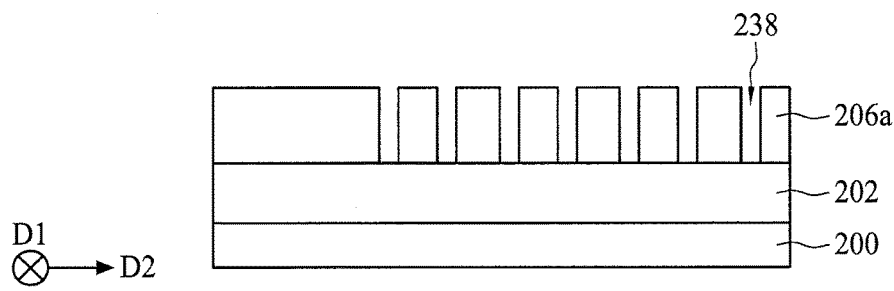
Figure 10C:
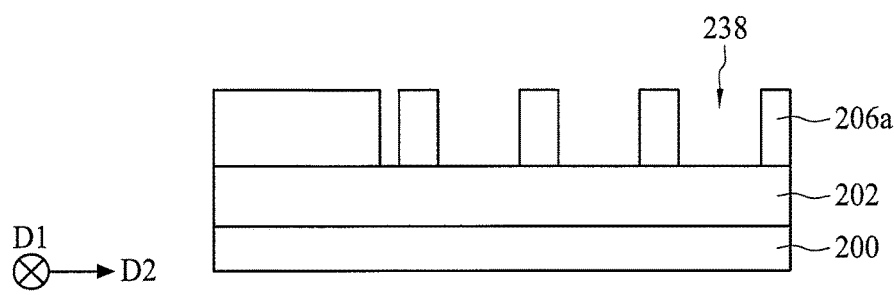

FIGS. 10A-10C are schematic diagrams illustrating a fabrication stage subsequent to the fabrication stage shown in FIGS. 9A-9C, wherein FIG. 10B is a cross-sectional view taken along line A-A' of FIG. 10A, and FIG. 10C is a cross-sectional view taken along line B-B' of FIG. 10A. In some embodiments of the present disclosure, the exposed hard mask 204 is etched to form a plurality of recesses 238 at least in the first hard mask layer 206a, but the disclosure is not limited thereto.

Figure 11A:
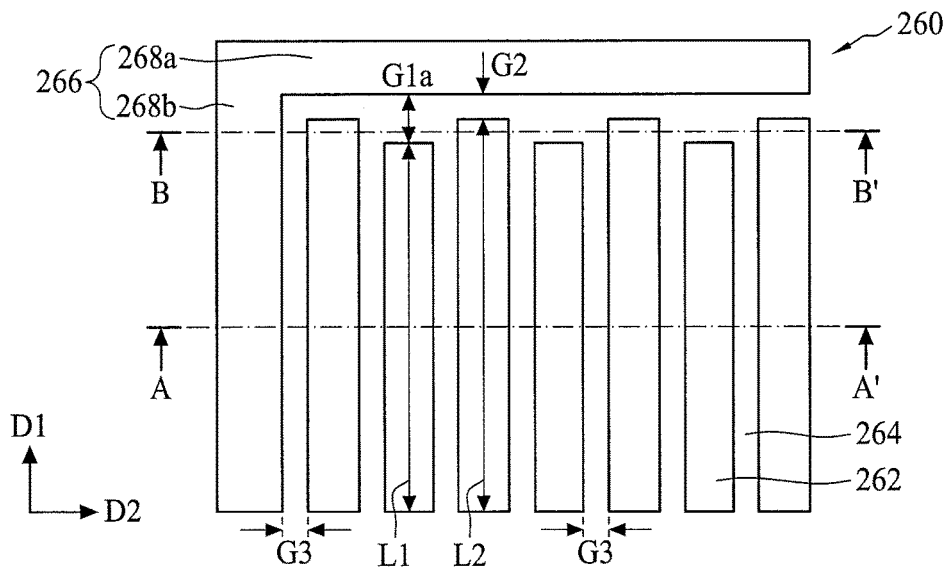
Figure 11B:
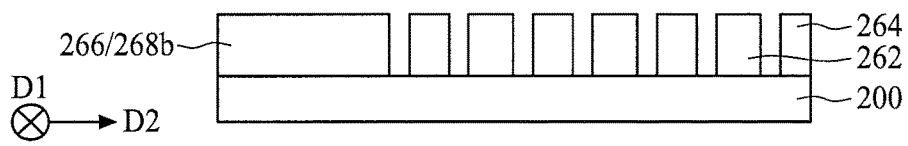
Figure 11C:
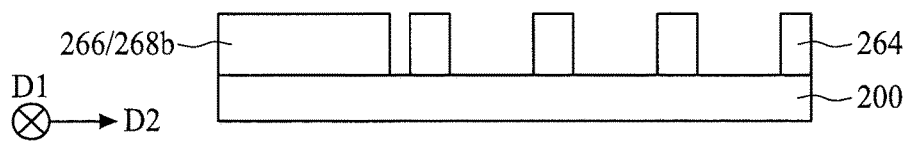

FIGS. 11A-11C are schematic diagrams illustrating a fabrication stage subsequent to the fabrication stage shown in FIGS. 10A-10C, wherein FIG. 11B is a cross-sectional view taken along line A-A' of FIG. 11A, and FIG. 11C is a cross-sectional view taken along line B-B' of FIG. 11A. In some embodiments of the present disclosure, the substrate 200 or the target layer 202 is etched to form a plurality of first semiconductor structures 262, a plurality of second semiconductor structures 264 and at least one semiconductor frame structure 266 through the recesses 238. The first semiconductor structures 262, the second semiconductor structures 264 and the semiconductor frame structure 266 form a semiconductor pattern 260 as shown in FIG. 11A.

Referring to FIGS. 11A to 11C, the semiconductor pattern 260 includes the substrate 200, the plurality of first semiconductor structures 262 disposed over the substrate 200, the plurality of second semiconductor structures 264 disposed over the substrate 200, and the semiconductor frame structure 266 disposed over the substrate 200. Accordingly, the first semiconductor structures 262, the second semiconductor structures 264, and the semiconductor frame structure 266 include a same material. The first semiconductor features 262 and the second semiconductor features 264 extend along the first direction D1 and are alternately arranged along the second direction D2. The first semiconductor structures 262 include the first length L1, the second semiconductor features 264 include the second length L2, and the first length L1 of the first semiconductor structures 262 is less than the second length L2 of the second semiconductor structures 264. although only a portion of the first semiconductor features 262, a portion of the second semiconductor features 264 and a portion of the semiconductor frame structure 266 are shown in FIG. 11A, those skilled in the art would easily realize that the semiconductor frame structure 266 encircles the first semiconductor structures 262 and the second semiconductor structures 264. In some embodiments of the present disclosure, the semiconductor frame structure 266 can include a first portion 268a perpendicular to the first semiconductor features 262 and the second semiconductor features 264. The semiconductor frame structure 266 can further include a second portion 268b parallel to the first semiconductor features 262 and the second semiconductor features 264. Each of the first semiconductor structures 262 is spaced to apart from the semiconductor frame structure 266. Specifically, each of the first semiconductor structures 262 is spaced apart from the first portion 268a of the semiconductor frame structure 266 by the gap G1a along the first direction D1. Each of the second semiconductor structures 264 is spaced apart from the semiconductor frame structure 266. Specifically, each of the second semiconductor structures 264 is spaced apart from the first portion 268a of the semiconductor frame structure 266 by the gap G2 along the first direction D1. The gaps G1a are larger than the gaps G2. As also shown in FIG. 11A, the first semiconductor structures 262 and the second semiconductor structures 264 are spaced apart from each other by the gap G3 along the second direction D2, and the width of the gaps G3 is substantially the same as the thickness T of the spacer layer 230. Furthermore, one of the second semiconductor structures 264 is disposed between the second portion 268b of the semiconductor frame structure 266 and the first semiconductor structures 262. In other words, one of the second semiconductor structures 264 is immediately adjacent to the second portion 268b of the semiconductor frame structure 266. The adjacent second semiconductor structure 264 and the second portion 268b of the semiconductor frame structure 266 are also spaced apart from each other by the gap G3.

In the present disclosure, the frame feature 214 is provided, and the gaps G1a between the first core features 212 and the frame feature 214 are formed. More importantly, the gaps G1a are filled by the spacer layer 230 and thus the plurality of individual recesses 232 is formed. Therefore, the second core features 242 formed in the individual recesses 232 are entirely separated from each other by the spacer layer 230. After removing the spacer layer 230, the first core features 212, the second core features 242 and the frame feature 214 that are spaced apart from each other can be transferred to the substrate 200 and/or a target layer 202. Accordingly, the first semiconductor structures 262, the second semiconductor structures 264 and the semiconductor frame structure 266 obtained by the abovementioned transferring are spaced apart from each other. The method for preparing the semiconductor structure 10 is referred to as a self-cutting method.

In contrast, in a comparative method without providing the frame feature, no individual recesses are formed between the first core features. More importantly, the subsequently-formed second core features are all connected to each other to form a comb-like pattern. Consequently, a plurality of second semiconductor structures, connected to each other, is obtained by transferring the second core features. As a result, one or more additional cutting steps are required to disconnect and separate the second semiconductor structures. Accordingly, process cost and process time are increased due to the cutting required by such methods.

One aspect of the present disclosure provides a semiconductor pattern. The semiconductor pattern includes a substrate, a plurality of first semiconductor structures disposed over the substrate, a plurality of second semiconductor structures disposed over the substrate, and a semiconductor frame structure disposed over the substrate. The first semiconductor features and the second semiconductor features are alternately arranged. The semiconductor frame structure encircles the first semiconductor structures and the second semiconductor structures. The first semiconductor structures include a first length, the second semiconductor features include a second length, and the first length of the first semiconductor structures is less than the second length of the second semiconductor structures.

One aspect of the present disclosure provides a method for preparing a semiconductor pattern. The method includes the following steps: A substrate is provided. A plurality of first core features and at least one frame feature encircling the first core features are formed over the substrate. The first core features extend along a first direction and are arranged along a second direction perpendicular to the first direction. The first core features include a first length. Each of the first core features is spaced apart from the frame feature by a first gap along the first direction. Subsequently, a spacer layer is formed to fill the first gaps and to form a plurality of individual recesses entirely separated from each other. A plurality of second core features is then formed in the individual recesses. The second core features are entirely separated from each other by the spacer layer. The second core features are spaced apart from the frame feature by the spacer layer. The second core features include a second length. The spacer layer is removed from the substrate to form a plurality of openings between the first core features, the second core features and the frame feature.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor pattern comprising:
   a substrate;
   a plurality of first semiconductor structures disposed over the substrate, the first semiconductor structures comprising a first length;
   a plurality of second semiconductor structures disposed over the substrate, the second semiconductor features comprising a second length, and the first semiconductor features and the second semiconductor features being alternately arranged; and
   a semiconductor frame structure disposed over the substrate, the semiconductor frame structure encircling the first semiconductor structures and the second semiconductor structures,
   wherein the first length of the first semiconductor structures is less than the second length of the second semiconductor structures.

2. The semiconductor pattern of claim 1, wherein the first semiconductor structures and the second semiconductor structures extend along a first direction and are arranged along a second direction perpendicular to the first direction.

3. The semiconductor pattern of claim 2, wherein each of the first semiconductor structures is spaced apart from the semiconductor frame structure by a first gap along the first direction, and each of the second semiconductor structures is spaced apart from the semiconductor frame structure by a second gap along the first direction.

4. The semiconductor pattern of claim 3, wherein the first gaps are larger than the second gaps.

5. The semiconductor pattern of claim 2, wherein the first semiconductor structures and the second semiconductor structures are spaced apart from each other by a third gap along the second direction.

6. The semiconductor pattern of claim 1, wherein the semiconductor frame structure comprises at least one first portion and one second portion, and the first portion and the second portion are perpendicular to each other.

7. The semiconductor pattern of claim 6, wherein the first portion of the semiconductor frame structure is perpendicular to the first semiconductor structures and the second semiconductor structures, and the second portion of the semiconductor frame structure is parallel to the first semiconductor structures and the second semiconductor structures.

8. The semiconductor pattern of claim 7, wherein one of the second semiconductor structures is disposed between the second portion of the semiconductor frame structure and the first semiconductor structures.

9. The semiconductor pattern of claim 1, wherein the first semiconductor structures, the second semiconductor structures, and the semiconductor frame structure comprise a same material.

* * * * *